United States Patent [19]
Takeuchi et al.

[11] Patent Number: 5,376,857
[45] Date of Patent: Dec. 27, 1994

[54] PIEZOELECTRIC DEVICE

[75] Inventors: Yukihisa Takeuchi, Nishikamo; Koji Kimura, Nagoya, both of Japan

[73] Assignee: NGK Insulators, Ltd., Japan

[21] Appl. No.: 206,939

[22] Filed: Mar. 7, 1994

[30] Foreign Application Priority Data

Mar. 8, 1993 [JP] Japan .................. 5-75414

[51] Int. Cl.$^5$ .............................. H01L 41/08
[52] U.S. Cl. ...................... 310/328; 310/358; 310/365
[58] Field of Search .............. 310/328, 324, 330–332, 310/365, 366, 357–359

[56] References Cited

U.S. PATENT DOCUMENTS

| | | | |
|---|---|---|---|
| 5,089,455 | 2/1992 | Ketcham et al. | 501/104 |
| 5,210,455 | 5/1993 | Takeuchi et al. | 310/328 |
| 5,281,888 | 1/1994 | Takeuchi et al. | 310/366 |

FOREIGN PATENT DOCUMENTS

| | | | |
|---|---|---|---|
| 2570223 | 3/1986 | France | H01L 41/08 |
| 62-213399 | 9/1987 | Japan | H04R 17/00 |
| 2161647 | 1/1986 | United Kingdom | H01L 41/18 |

*Primary Examiner*—Mark O. Budd
*Attorney, Agent, or Firm*—Parkhurst, Wendel & Rossi

[57] ABSTRACT

A piezoelectric device (1) includes an at least locally thin-walled ceramic substrate (2) and at least one piezoelectric transducer (3) on the substrate (2). The piezoelectric transducer (3) includes a lower electrode layer (4), a piezoelectric layer (5) and an upper electrode layer (6) which are sequentially laminated with each other. The piezoelectric layer (5) has a dimension which is sufficient to cover substantially completely the lower electrode layer (4). The piezoelectric layer (5) has at least one edge (7) which protrudes beyond the lower electrode layer (4) and which is at least locally incompletely bonded to the ceramic substrate (2).

12 Claims, 7 Drawing Sheets

FIG_1A
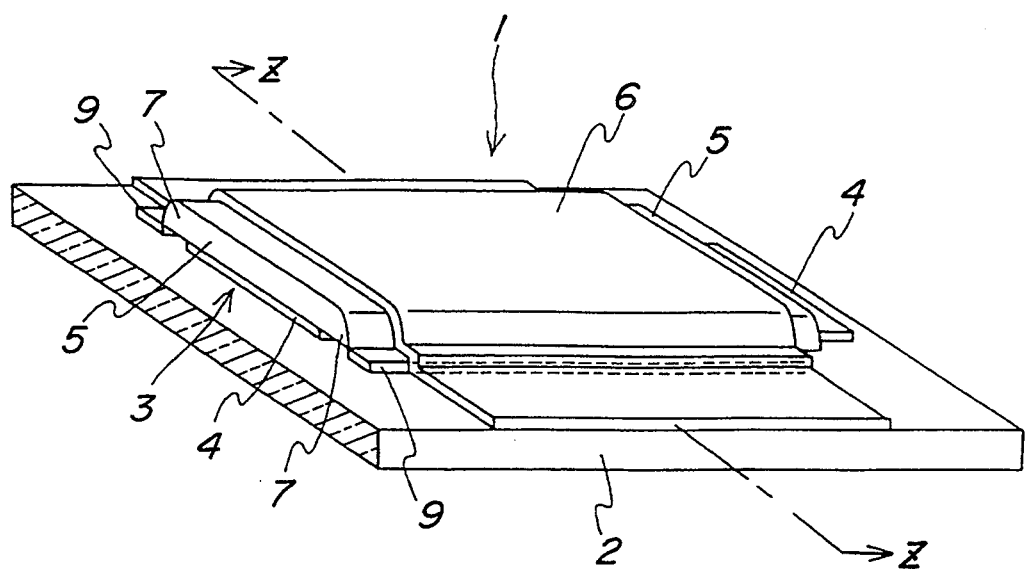
FIG_1B
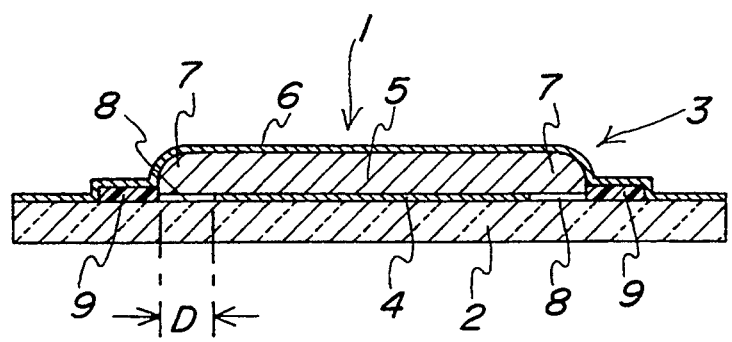

FIG_2
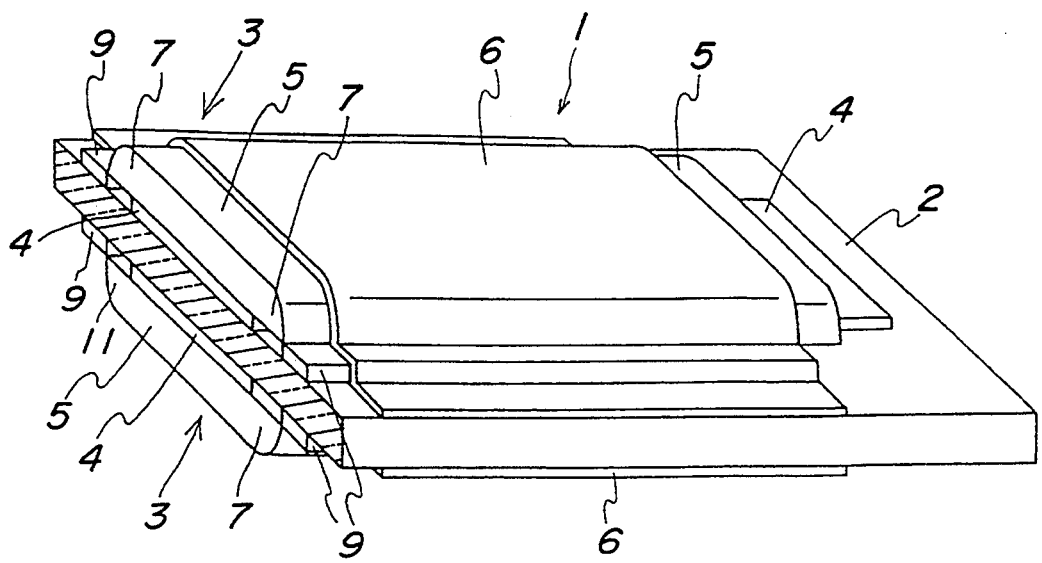
FIG_3
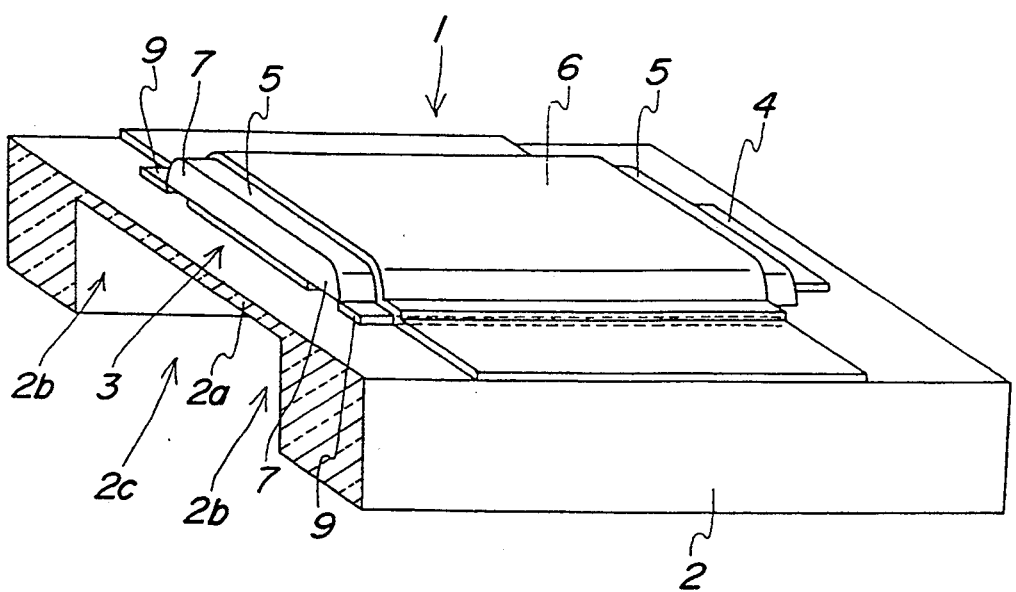

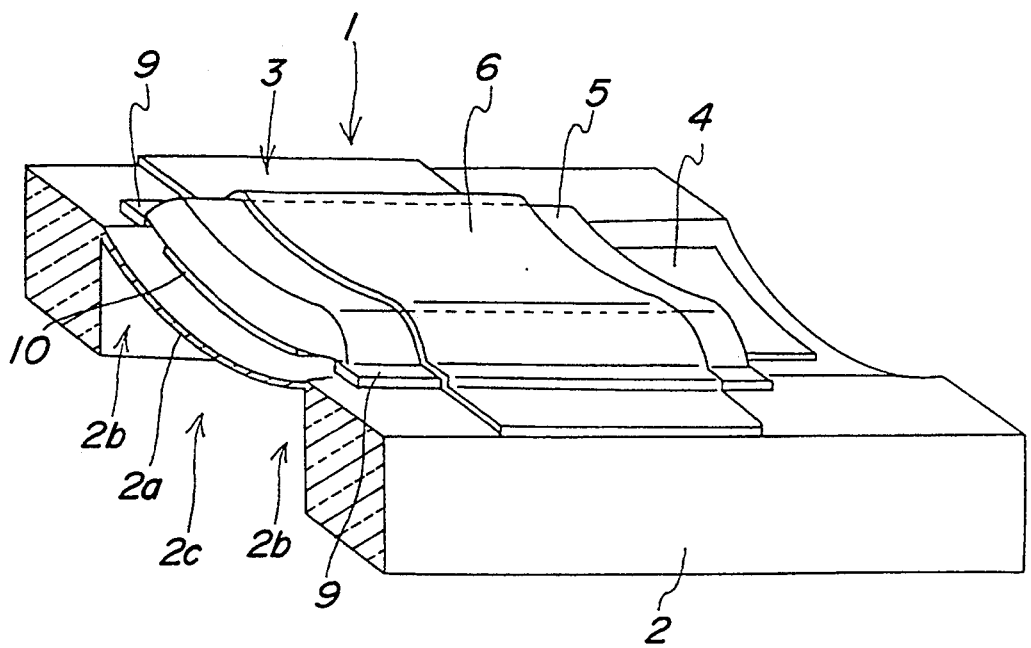
FIG_4
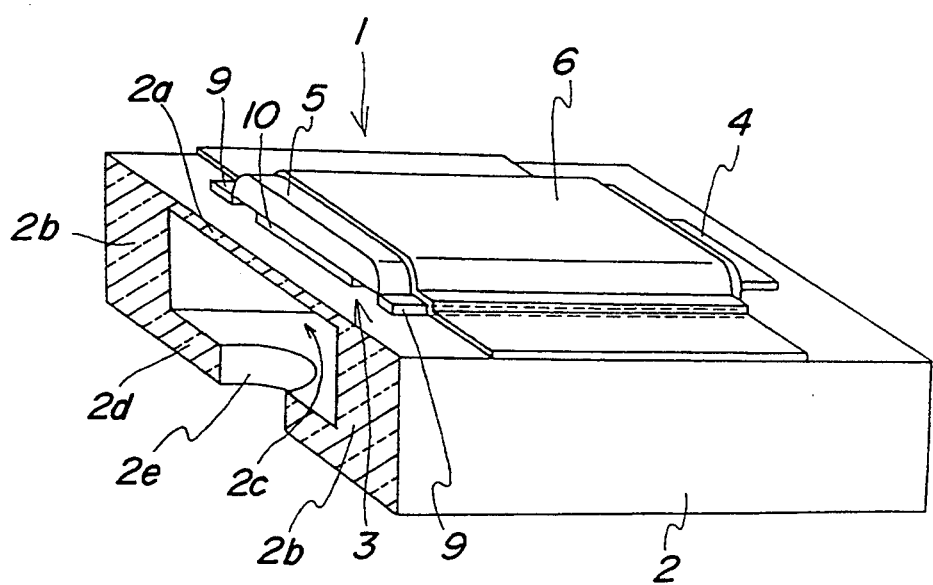
FIG_5

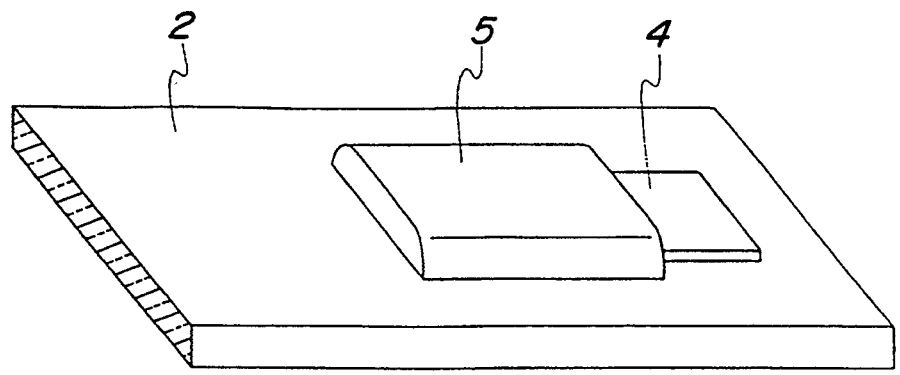
FIG._6A
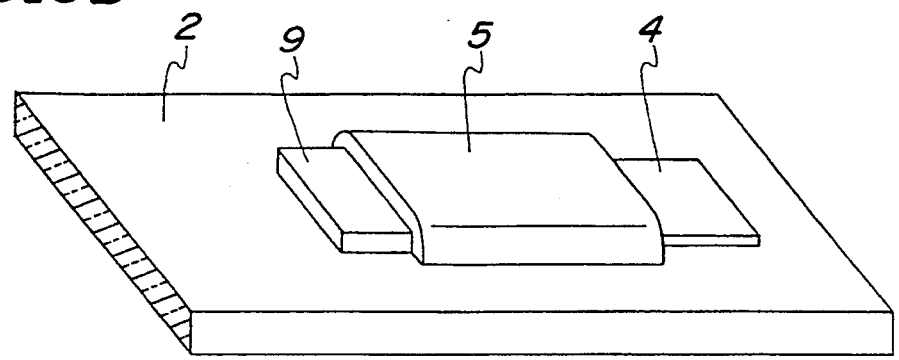
FIG._6B
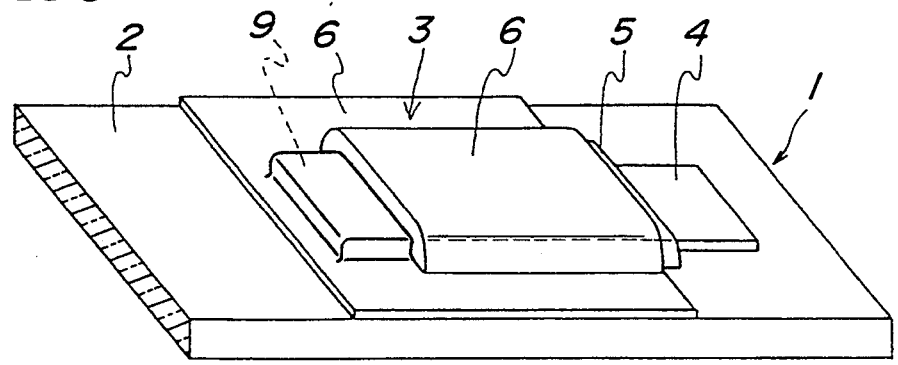
FIG._6C

FIG_7A
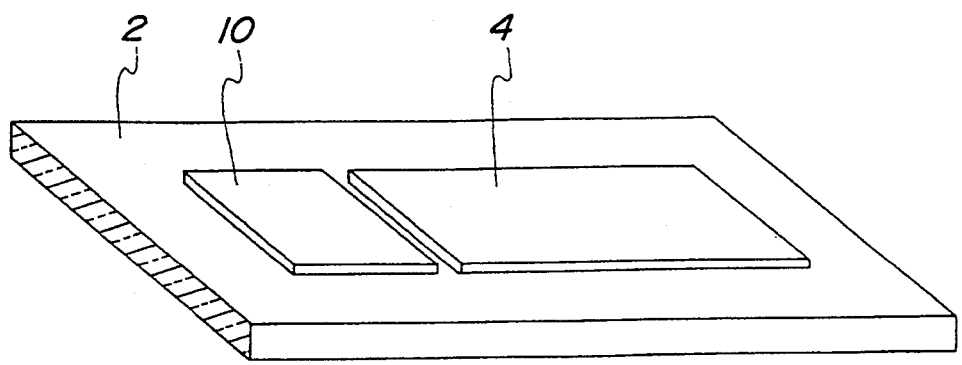
FIG_7B
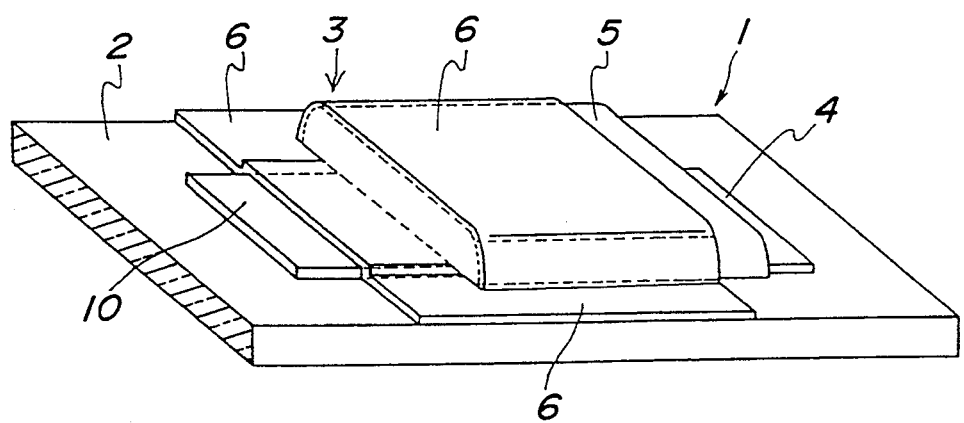

FIG_8A
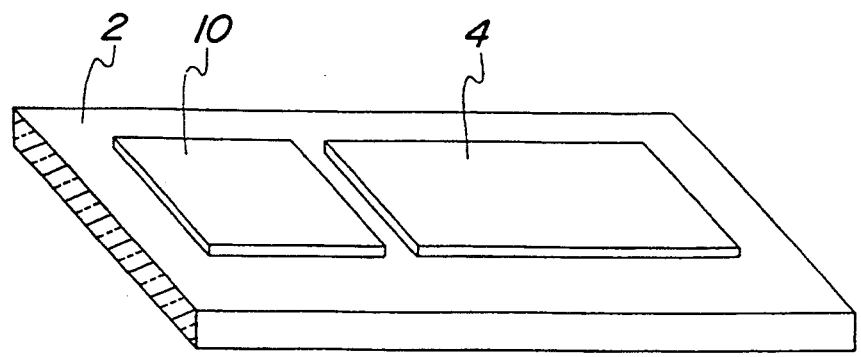
FIG_8B
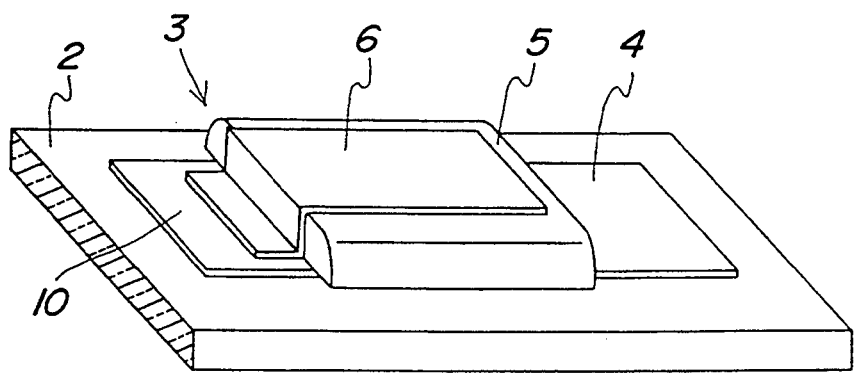

FIG_9
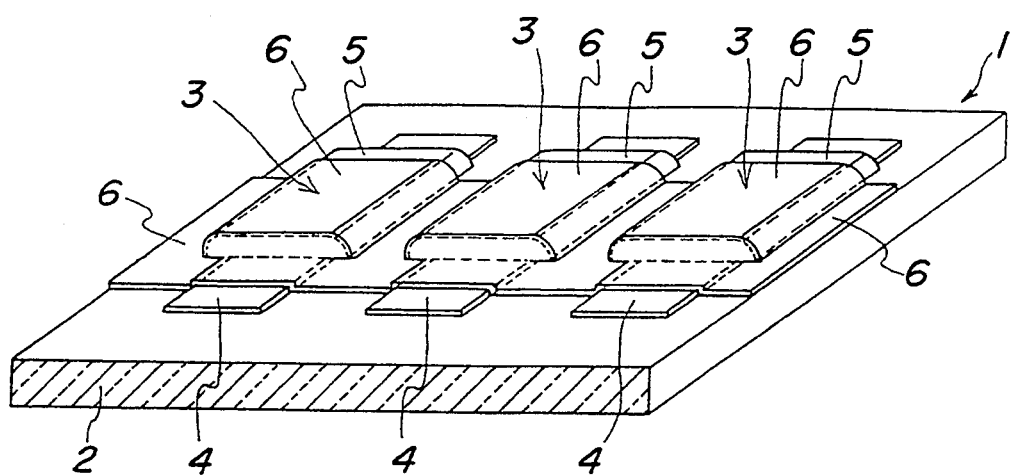
FIG_10
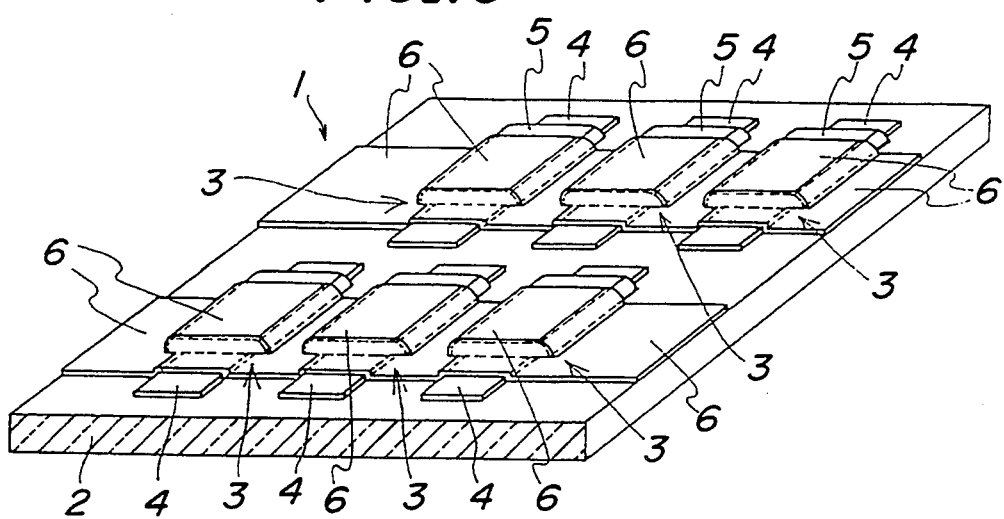

PIEZOELECTRIC DEVICE

BACKGROUND OF THE INVENTION

1. Field of the Invention

The present invention relates to a piezoelectric device for converting an input mechanical quantity into an output electrical quantity, and vice versa.

2. Description of the Related Art

As generally known in the art, piezoelectric devices are typically used to convert an input mechanical stress into an output electric charge (voltage) and also to convert an input electric voltage into an output mechanical distortion. In the latter case, the output distortion can be used to generate mechanical force, displacement or vibration, and the device is sometimes called as an electrostrictive device. The term "piezoelectric device" as used herein is to be interpreted in its broadest sense, as encompassing an electrostrictive device as well. Similarly, the term "piezoelectric material" as used herein is to be interpreted in its broadest sense as encompassing an electrostrictive material as well.

Conventionally, piezoelectric devices have been used for detecting fine mechanical displacement or for adjusting lengths and/or positions of the optical path on a sub-micron order. There have been known unimorphor bimorph-type piezoelectric devices which serve to convert an electrical voltage into a bending or flexural deformation as actuators for ink jet printing heads, for example. In this instance, customers' or end users' requirements are oriented to a high-quality and high-speed printing performance, and it is desirable to realize an improved device with a minimized size and operability at a low driving voltage, which provides a satisfactory response characteristic and operational reliability.

Known unimorph- or bimorph-type piezoelectric devices typically include a first electrode layer, a piezoelectric layer and a second electrode layer which are sequentially laminated with each other. With such an arrangement of the piezoelectric layer and the electrode layers, it is important for the piezoelectric layer to have a dimension which is sufficient to cover the first electrode layer so as to avoid short-circuit between the first and second electrode layers and to assure a proper operation of the device. In this instance, however, when the piezoelectric layer has an edge which protrudes beyond the first electrode layer, the edge does not perform a piezoelectric function and may restrict the desired movement, relative to the substrate, of the remaining region of the piezoelectric layer which does perform the intended piezoelectric function. This is because the edge may be brought into a rigidly bonded state with the substrate due to chemical reaction or sintering caused by firing of the films for manufacturing the device. In other words, a rigidly bonded state between the substrate and the edge of the piezoelectric layer should be avoided in order to enable the piezoelectric layer to undergo an unrestricted movement and to achieve satisfactorily the intended functions. Therefore, it has been a conventional practice to adjust the dimension of the piezoelectric layer so that the edges of the piezoelectric layer are precisely aligned with those of the first electrode layer. Such an alignment requires a fine positioning of the relevant layers and leads to practical difficulty in realizing an improved productivity.

DISCLOSURE OF THE INVENTION

The present invention thus contemplates to provide a novel piezoelectric device which can be readily manufactured with an improved productivity and which yet achieves satisfactory reliability and functions by avoiding short-circuit between the electrode layers while ensuring an unrestricted movement of the piezoelectric layer relative to the substrate.

Briefly stated, the present invention provides a piezoelectric device which comprises an at least locally thin-walled ceramic substrate and at least one piezoelectric transducer formed on the substrate. The piezoelectric transducer includes a first electrode layer, a piezoelectric layer and a second electrode layer which are sequentially laminated one above the other. The piezoelectric layer has a dimension which is sufficient to cover substantially completely the first electrode layer, and has at least one edge in the form of an extension which protrudes beyond the first electrode layer and which is at least locally incompletely bonded to the ceramic substrate.

The term "incomplete bond" as used herein refers to a specific bonded state between the ceramic substrate and at least one edge of the piezoelectric layer, which allows the piezoelectric layer to undergo a substantially unrestricted movement relative to the substrate. Moreover, the term in question refers to the bonded state as a whole, and does not exclude local presence of a completely bonded state. Thus, there may be instances wherein any location of the edges of the piezoelectric layer is out of a completely bonded state with the substrate, or wherein the edges of the piezoelectric layer are only locally in a completely bonded state with the substrate, with remaining regions of the edges being out of a completely bonded state with the substrate.

The above-mentioned arrangement of the present invention makes it readily possible to manufacture the piezoelectric device with an improved productivity, because it is not necessary to align the edges of the piezoelectric layer with those of the first electrode layer. The piezoelectric layer of the device according to the present invention has at least one edge in the form of an extension which protrudes beyond the first electrode layer, and thus completely covers the first electrode layer to avoid short-circuit between the first and second electrode layers. Moreover, the incompletely bonded state between the ceramic substrate and at least one edge of the piezoelectric layer protruding beyond the first electrode layer allows the piezoelectric layer to be moved relative to the substrate in an unrestricted sense. It is thus possible to achieve satisfactory reliability and functions of the device, e.g., generation of a large force or displacement or a high output voltage level.

The abovementioned incompletely bonded state between the edge of the piezoelectric layer and the ceramic substrate may be conveniently expressed in terms of an average peeling strength which represents a force per unit area, required to separate the piezoelectric layer from the substrate. According to the present invention, it is advantageous for the edge of the piezoelectric layer to have an average peeling strength which is 0.125 kgf/mm$^2$ or less, preferably 0.025 kgf/mm$^2$ or less, and further preferably 0.0125 kgf/mm$^2$ or less.

Advantageously, the piezoelectric device according to the present invention further comprises at least one dummy layer for incompletely bonding the edge of the piezoelectric layer to the ceramic substrate. In this instance, the dummy layer preferably comprises an electrically insulating material.

Alternatively, the ceramic substrate may comprise a ceramic material having a low reactivity with the piezoelectric material forming said piezoelectric layer.

In this instance, the ceramic substrate may comprise zirconium oxide as a major component, having a crystal phase that has been completely or partially stabilized preferably by an addition of at least one member selected from a group consisting of yttrium oxide, cerium oxide, magnesium oxide and calcium oxide.

Also, the piezoelectric layer may comprise a material with a major component which comprises a mixture of lead magnesium niobate, lead zirconate and lead titanate, or a mixture of lead nickel niobate, lead magnesium niobate, lead zirconate and lead titanate.

According to the present invention, the piezoelectric transducer may be formed as a film on the thin-walled ceramic substrate. In this instance, it is possible to generate a large force or displacement at a relatively low operational voltage or to generate a high potential at a relatively small input displacement, with an excellent response characteristic. Moreover, when the transducer is formed by a known film formation process, the device can be readily provided with a desired number of piezoelectric transducers on the same substrate without using adhesives, thereby enabling a high density integration of the device.

BRIEF DESCRIPTION OF THE DRAWINGS

The present invention will be explained in further detail, by referring to the accompanying drawings in which:

FIG. 1A is a perspective view showing one embodiment of the unimorph-type piezoelectric device according to present invention;

FIG. 1B is a cross-sectional view taken along line Z—Z in FIG. 1A;

FIG. 2 is a partly broken perspective view showing one embodiment of the bimorph-type piezoelectric device according to present invention;

FIG. 3 is a perspective view showing another embodiment of the present invention in which the ceramic substrate defines a cavity;

FIG. 4 is a perspective view showing another embodiment of the present invention in which the piezoelectric layer is convex and protrudes toward the ceramic substrate;

FIG. 5 is a perspective view showing another embodiment of the present invention in which the cavity in the ceramic substrate has a bottom;

FIGS. 6A to 6C are perspective views showing a modified arrangement of the resin layer;

FIGS. 7A and 7B are perspective views showing a modified device according to the present invention which is provided with an auxiliary electrode layer;

FIG. 8A and 8B are perspective views showing a modified device according to the present invention, in which the upper electrode layer is connected to the auxiliary electrode layer;

FIG. 9 is a perspective view showing another embodiment of the present invention, in which a plurality of transducers are arranged on a ceramic substrate in series with each other; and FIG. 10 is a perspective view showing still another embodiment of the present invention, in which a plurality of transducers are arranged on a ceramic substrate in a zig-zag manner.

It should be noted that same reference numerals are used throughout the entire drawing figures to denote the same or corresponding elements.

DETAILED DESCRIPTION OF THE PREFERRED EMBODIMENTS

Referring now to FIGS. 1A and 1B, there is shown a basic embodiment of the unimorph-type piezoelectric device according to the present invention, which is denoted as a whole by reference numeral 1. The piezoelectric device 1 includes a generally thin-walled ceramic substrate 2 and a piezoelectric transducer 3 on the substrate 2. The piezoelectric transducer 3 has been formed integrally with the substrate 2 by an ordinary film-formation process to be described hereinafter, wherein a first electrode layer 4, a film-shaped piezoelectric layer 5 and a second electrode layer 6 are sequentially laminated one above the other. The first electrode layer 4 and the second electrode layer 6 may be referred to as a lower electrode layer and an upper electrode layer, respectively.

According to the present invention, the piezoelectric layer 5 has a dimension which is sufficient to substantially completely cover the lower electrode layer 4. More specifically, the piezoelectric layer 5 has edges 7 in the form of extensions which protrude beyond the relevant edges of the lower electrode layer 4 in a plane parallel to the general surface of the substrate 2. The distance D by which the edges of the piezoelectric layer 5 protrude beyond the lower electrode layer 4 may be at least 10 $\mu$m, preferably 20 $\mu$m or more, and further preferably 50 $\mu$m or more.

Such an arrangement of the piezoelectric layer 5 serves to avoid positively a short-circuit between the two electrode layers 4, 6, without requiring a precise alignment of the edges of the piezoelectric layer 5 relative to those of the lower electrode layer 4. It is thus possible to realize readily a reliable operation of the device while improving the manufacturing productivity and reducing the manufacturing cost.

According to the present invention, the piezoelectric layer 5 along its edges 7, e.g. widthwise edges, is incompletely bonded to the substrate 2 either entirely or locally, as shown at 8. Due to the incompletely bonded region 8 between the substrate 2 and the edges 7 of the piezoelectric layer 5, the piezoelectric layer 5 is allowed to undergo a substantially unrestricted movement relative to the substrate 2 thereby to achieve satisfactorily the desired functions in operation of the device. The incompletely bonded region 8 between the piezoelectric layer 5 and the ceramic substrate 2 may be such that each edge 7 of the piezoelectric layer 5 has an average peeling strength as defined above, which is 0.125 kgf/mm$^2$ or less, preferably 0.025 kgf/mm$^2$ or less, and further preferably 0.0125 kgf/mm$^2$ or less.

The incompletely bonded region 8 between the substrate 2 and the piezoelectric layer 5 may be formed by primarily utilizing a low reactivity between the ceramic material for the substrate 2 and the piezoelectric material for the piezoelectric layer 5, as will be explained hereinafter. Alternatively, the incompletely bonded region 8 may be formed by initially providing the ceramic substrate 2 with dummy layers at the surface regions which correspond to the edges 7 of the piezoelectric layer 5, and subsequently forming the piezoelectric layer 5 so as to avoid a direct contact of the edges 7 to the ceramic substrate 2. The dummy layers preferably comprise a resin or the like material which can be burned out and partly or completely extinguished during the heat treatment of the piezoelectric layer 5 to be explained hereinafter. In this instance, when the dummy layers comprise an electrically insulating material, partly extinguished dummy layers may be left between the substrate 2 and the piezoelectric layer 5, provided that the desired incompletely bonded region 8 can be maintained.

On the other hand, however, the incompletely bonded region 8 between the ceramic substrate 2 and the piezoelectric layer 5 may give rise to formation of discontinuous surface regions along the boundary between the substrate 2 and the edges 7 of the piezoelectric layer 5. In this instance, the regions of the upper electrode layer 6 adjacent to the discontinuous surface regions may be damaged due to impact or vibration during the production of the device or in the use condition.

For protecting the upper electrode layer 6 from the damages as mentioned above, resin layers 9 may be arranged adjacent to the edges 7 of the piezoelectric layer 5, between the substrate 2 and the upper electrode layer 6. The resin layers 9 are preferably composed of a relatively soft and resilient resin material as compared to the ceramic material of the substrate 2, in view of possible adverse influences to the generation of force or flexural motion of the piezoelectric layer 5. Thus, such a resin material may be appropriately selected from a group comprising rubbery resin, polyimide resin, vinyl resin, acrylic resin, polyamide resin, phenolic resin, resorcinol resin, urea resin, melamine resin, polyester resin, silicone resin, furan resin, polyurethane resin, epoxy resin, polyolefin resin, and the like. The resin layers 9 may locally extend into the space between the substrate 2 and the piezoelectric layer 5, provided here also that the desired incompletely bonded region 8 can be maintained.

In operation of the piezoelectric device described above, when a predetermined operational voltage is applied between the two electrode layers 4, 6 through respective leads (not shown), an electric field is generated and acts on the piezoelectric layer 5 to induce a flexural motion of the piezoelectric layer 5 or to generate a force in a direction perpendicular to the general surface of the substrate 2, as a result of the transverse effect of the field-induced distortion. In this instance, due to the incompletely bonded region 8 between the ceramic substrate 2 and the edges of the piezoelectric layer 5, the piezoelectric layer 5 can be moved relative to the substrate 2 in an unrestricted sense. It is thus possible to achieve an efficient generation of a large displacement or force at a relatively low operational voltage.

Another embodiment of the piezoelectric device is shown in FIG. 2, wherein the present invention is applied to a bimorph-type piezoelectric device. That is to say, the piezoelectric device 1 of this embodiment includes a generally thin-walled ceramic substrate 2 and a pair of piezoelectric transducers 3 on both sides of the substrate 2. Except for the provision of the piezoelectric transducers 3 on both sides of the substrate 2, the structure of this embodiment is essentially same as the previous one. Thus, the piezoelectric layers 5 along their edges 7 are at least locally incompletely bonded to the substrate 2. Therefore, the bimorph-type piezoelectric device shown in FIG. 2 provides all the advantages discussed above, and is capable of efficiently generating a large displacement or force.

Still another embodiment of the piezoelectric device 1 is shown in FIG. 3, wherein the present invention is applied to a unimorph-type piezoelectric device. This embodiment is essentially same as that of FIG. 1 but differs therefrom in that the device 1 includes a locally thin-walled ceramic substrate 2. Thus, the ceramic substrate 2 has a thin-walled center region 2a and thick-walled edge regions 2b on both sides of the center region 2a. These edge regions 2b define a cavity 2c on the rear side of the substrate 2. The piezoelectric transducer 3 is integrally formed on the thin-walled region 2a of the substrate 2 so that the piezoelectric layer 5 is movable toward and away from the substrate 2 in operation of the device 1.

The unimorph-type piezoelectric device 1 shown in FIG. 3 can be suitably used as an actuator for an ink jet printing head which is adapted to discharge ink for printing characters or codes by a predetermined number of dots. In this case, ink is stored in the cavity 2c and discharged therefrom as the piezoelectric layer 5 together with the thin-walled region 2a undergoes a flexural motion toward the cavity 2c to reduce its volume. In this embodiment also, the incompletely bonded region 8 between the ceramic substrate 2 and the piezoelectric layer 5 allows the flexural motion or force generated by the piezoelectric layer 5 to be efficiently transmitted to the thin-walled region 2a of the substrate 2. Therefore, it is possible to realize a large displacement and an excellent response characteristic of the device as particularly required for ink jet printing heads.

A modified embodiment of the unimorph-type piezoelectric device 1 is shown in FIG. 4, which is essentially same as the embodiment of FIG. 3 but differs therefrom in that the device 1 includes a piezoelectric transducer 3 which is convex in shape so that its center region protrudes toward the substrate 2. In comparison to a flat piezoelectric transducer, the convex piezoelectric transducer 3 according to the present embodiment can be more effectively displaced toward the substrate 2 in operation of the device. This makes it readily possible to provide a further improved conversion efficiency of the device and to suppress the displacement of the transducer 3 in the opposite direction, i.e., in a direction away from the substrate 2. Furthermore, when ink or the like fluid is discharged from the cavity 2c and the thin-walled region 2a is applied with a reaction force generated by the discharge pressure, the thin-walled region 2a having a corresponding concave shape effectively minimizes the deflection of the substrate 2 toward the transducer 3 and hence the pressure loss.

Another modified embodiment of the unimorph-type piezoelectric device 1 is shown in FIG. 5, which is essentially same as the embodiment of FIG. 3 but differs therefrom in that the cavity 2c is closed by a bottom plate 2d which is formed with an opening 2e extending therethrough and having a circular or other appropriate cross-section. The bottom plate 2d provides a relatively high rigidity of the substrate 2 as a whole and thus serves to minimize undesirable interaction between neighboring devices. When the piezoelectric device 1 is to be integrally secured to an associated component, the rear surface of the bottom plate 2d affords an increased surface area for adhesive material or the like and thereby serves to realize an improved face-to-face connection. The opening 2e in the bottom plate 2d may be used as an inlet which is in communication with an ink reservoir, and/or as an outlet which is in communication with a discharge nozzle. The piezoelectric device 1 according to the present embodiment may include, besides the above-mentioned resin layer 9 associated with the widthwise edges 7 of the piezoelectric layer 5, an auxiliary electrode layer 10 which is arranged on a predetermined region of the ceramic substrate 2 adjacent to a lengthwise edge of the piezoelectric layer 5. Specifically, the auxiliary electrode layer 10 which has also been shown in FIG. 4 is arranged at a location where it does not restrict the desired movement of the piezoelectric layer 5 relative to the substrate 2. The auxiliary electrode layer 10 also serves to protect the upper electrode layer 6 from damage which may arise from the incompletely bonded region 8 between the ceramic substrate 2 and the piezoelectric layer 5. The auxiliary electrode layer 10 may be connected to the upper electrode layer 6 and isolated from the lower electrode layer 4.

FIGS. 6A to 6C illustrate that, depending upon the pattern of the upper electrode layer 6 of the piezoelectric device 1, the device 1 may be provided with a synthetic resin dummy layer 9 which is arranged adjacent to the lengthwise edge of the piezoelectric layer 5. For manufacturing such a piezoelectric device 1, as shown in FIG. 6A, the ceramic substrate 2 in the first place is formed with the lower electrode layer 4 and the piezoelectric layer 5. In this instance, both widthwise edges and one of the lengthwise edges of the piezoelectric layer 5 are arranged to protrude beyond the relevant edges of the lower electrode layer 4. These edges of the piezoelectric layer 5 are incompletely bonded to the substrate 2. Subsequently, as shown in FIG. 6B, the ceramic substrate 2 is provided with the dummy resin layer 9 at a region adjacent to the lengthwise edge of the piezoelectric layer 5. Finally, as shown in FIG. 6C, the upper electrode layer 6 is formed to cover the dummy resin layer 9 and the piezoelectric layer 5, without covering another lengthwise edge of the piezoelectric layer 5 and the corresponding edge region of the lower electrode layer 4 which are to be connected to the respective leads, not shown.

Another modified embodiment of the unimorph-type piezoelectric device 1 is shown in FIGS. 7A and 7B, which is essentially same as the embodiment of FIGS. 1A and 1B and which further includes an auxiliary electrode layer 10 formed on a predetermined region of the ceramic substrate 2 adjacent to one of the lengthwises edges of the piezoelectric layer 5. To manufacture such a piezoelectric device 1, as shown in FIG. 7A, the ceramic substrate 2 in the first place is provided with the lower electrode layer 4 and the auxiliary electrode layer 10. Subsequently, the piezoelectric layer 5 is formed on the lower electrode layer 4 such that the lengthwise edge and both widthwise edges of the piezoelectric layer 5 protrude beyond the relevant edges of the lower electrode layer 4. These edges of the piezoelectric layer 5 are incompletely bonded to the substrate 2. Finally, as shown in FIG. 7B, the upper electrode layer 6 is formed to cover the piezoelectric layer 5 and the auxiliary electrode layer 10, without covering another lengthwise edge of the piezoelectric layer 5 and the corresponding edge region of the lower electrode layer 4, as well as part of the auxiliary electrode layer 10, which are to be connected to the respective leads, not shown. As in the embodiment of FIG. 5, the auxiliary electrode layer 10 serves to protect the upper electrode layer 6 from damages which may arise from the incompletely bonded region 8 between the ceramic substrate 2 and the piezoelectric layer 5. The auxiliary electrode layer 10 may be connected to the upper electrode layer 6 and isolated from the lower electrode layer 4.

The embodiment of FIGS. 7A and 7B may be modified such that the upper electrode layer 6 is formed to cover only predetermined regions of the piezoelectric layer 5 and the auxiliary electrode layer 10, as shown in FIGS. 8A and 8B.

Another modified embodiment of the piezoelectric device 1 according to the present invention is shown in FIG. 9, which is essentially same as the embodiment of FIGS. 1A and 1B. In the present embodiment, a plurality of piezoelectric transducers 3 forming a row is formed on a relatively large ceramic substrate 2 which is generally thin-walled, and the transducers 3 are arranged at a predetermined pitch with respect to each other. As shown in FIG. 10, the piezoelectric device 1 according to the present invention may include a predetermined number of piezoelectric transducers 3 (e.g., 96 in number) which are formed on the substrate 2 and arranged in a zig-zag manner. This type of arrangement is particularly suitable for ink jet printing heads which serve to discharge ink for printing characters or codes by a predetermined number of printed dots. The embodiments of FIGS. 3, 4 and 5 may also be modified to include a predetermined number of piezoelectric transducers 3 on a relatively large substrate 2 having a corresponding number of cavities.

In order to realize the above-mentioned incompletely bonded region 8 between the ceramic substrate 2 and the edges of the piezoelectric layer 5, the substrate 2 preferably comprises zirconium oxide as a main component, having a crystal phase that has been completely or partially stabilized preferably by the addition of at least one compound selected from a group consisting of yttrium oxide, cerium oxide, magnesium oxide and calcium oxide.

The amount of additives required for partially or completely stabilizing the zirconium oxide as described above may be 1–30 mol % for yttrium oxide, 6–50 mol % for cerium oxide, and 5–40 mol % for the magnesium oxide and calcium oxide. As for yttrium oxide in particular, the amount is preferably 2–7 mol %, more preferably b 2–4 mol %, because the zirconium oxide added with the yttrium oxide of such amount has a partially stabilized crystal phase and thus exhibits particularly excellent substrate characteristics.

The ceramic substrate 2 may have an overall thin plate-like shape as shown in FIGS. 1A and 1B, FIG. 2, FIGS. 6A to 6C, FIGS. 7A and 7B, FIG. 9 or FIG. 10, or may be formed with at least one local cavity 2c having a bottom surface which defines the thin-walled region 2a for forming the piezoelectric transducer 3 thereon, as shown in FIGS. 3 to 5. The latter type of the ceramic substrate 2 is often preferable since only those regions corresponding to the piezoelectric transducers 3 are thin-walled, and it is thus readily possible to preserve the desired high mechanical strength of the substrate 2 as a whole. Furthermore, particularly when a plurality of piezoelectric transducers 3 is formed on a substrate 2, adjacent transducers 3 in operation can be effectively prevented from undesirable interaction with each other due to the presence of relatively rigid thick-walled regions between the adjacent thin-walled regions.

In the case of the ceramic substrate 2 formed with at least one cavity 2c for defining the thin-walled region 2a, the cavity 2c has dimensions which are preferably determined such that the length of the cavity is 2–20 times larger than its width. Furthermore, for assuring a sufficient amount of displacement or force to be generated by the piezoelectric transducer 3, the transducer 3 is formed on the thin-walled region 2a of the substrate 2 over an area which preferably corresponds to 50–95% of the width of the cavity 2c.

As for the thickness of the thin-walled region 8 of the ceramic substrate 2, in order to provide an improved high-speed response characteristic and a high conversion efficiency of the piezoelectric transducer 3, the thin-walled region of the ceramic substrate 2 has a thickness which is preferably 50 $\mu$m or less, more preferably 30 $\mu$m or less, and further more preferably 10 $\mu$m or less.

The green sheet for the ceramic substrate 2 may be subjected to sintering at a temperature of 1,000° C. to 1,800° C. prior to formation of the piezoelectric transducer 3. Alternatively, the green sheet for the ceramic substrate 2 may be subjected to a suitable film-formation process to form the piezoelectric transducer 3, and then to sintering. Formation of the piezoelectric transducer 3 on the previously sintered ceramic substrate 2 is often desirable in view of minimization of warp in the final product and realization of dimensional accuracy of the piezoelectric transducer 3.

A preferred method of forming the ceramic substrate 2 with at least one cavity 2c is to prepare a first green sheet having a desired thickness and formed with at least one recess by using a suitable mold or machining process, such as ultrasonic machining. A second, relatively thin green sheet is further prepared to have a thickness which corresponds to that of the thin-walled region of the substrate. The second green sheet is superimposed on the first green sheet under predetermined temperature/pressure condition, and then fired and integrated with each other.

The material for the ceramic substrate 2 may contain a sintering aid, such as clay or the like. In this case, it is desirable to adjust the composition and amount of the sintering aid so that at least the sintered thin-walled region of the substrate does not contain a vitreous material such as silicone oxide, boron oxide, phosphorus oxide, germanium oxide, by an amount of 1% or more. This is because an excessive amount of vitreous material often results in undesirable reaction of the substrate material with the piezoelectric material during the heat treatment, making it difficult to control the composition of the piezoelectric material.

To ensure that the ceramic substrate 2 which has been formed as explained above permits satisfactory operational characteristics of the piezoelectric transducer 3 formed thereon, the surface roughness Ra of the substrate 2 is controlled to be within a range of 0.03–0.9 $\mu$m. In this instance, the distortion or stress occurring in the piezoelectric transducer 3 can be effectively transmitted to the substrate 2 having the above-mentioned range of the surface roughness Ra, and vice versa. Such a control of the surface roughness is also effective to assure a high mechanical strength of the relatively thin substrate.

The piezoelectric transducer 3 on the ceramic substrate 2 comprising the electrode layers 4, 6 and the piezoelectric layer 5 may be formed by a suitable film-formation process known, per se. That is to say, the film-formation process which may be applied to form the piezoelectric transducer 3 of the device 1 according to the present invention includes a thick-film formation process such as screen printing, spraying, dipping or coating, and a thin-film formation process such as ion beam method, sputtering, vacuum vapor deposition, ion plating, chemical vapor deposition (CVD) or plating. In particular, the thick-film formation process can be advantageously applied to form a film-like piezoelectric layer. This is because the thick-film formation process makes it readily possible to form a film on the ceramic substrate by using a paste or slurry whose major component is powder of piezoelectric ceramic material. In this case, when the powder of piezoelectric ceramic material has an average particle size within a range of 0.01 $\mu$m to 5 $\mu$m, preferably 0.05 $\mu$m to 3 $\mu$m, it is readily possible to realize excellent operational characteristics of the piezoelectric device. While the pattern of such a film may be formed by the screen printing method or photolithography method, the pattern may also be formed by removing unnecessary regions of the film by laser cutting, slicing, ultrasonic machining or other suitable machining process.

The present invention is not limited to the specific construction, shape and/or pattern of the piezoelectric transducer illustrated in the drawings. For example, depending upon the utility of the piezoelectric device, the transducer may have triangular, rectangular or other polygonal shape, circular, elliptical or annular shape, comb- or lattice-like pattern, or any combination of these shapes and/or patterns.

The electrode layers 4, 6 and the piezoelectric layer 5 formed on the ceramic substrate 2 by a selected method as explained above may be either heat-treated in different steps for integration with the substrate each time a layer has been formed on the substrate, or simultaneously heat-treated in a single step for integration with the substrate after all the layers have been formed into a laminated structure on the substrate. In any case, it is possible incompletely to bond the edges of the piezoelectric layer 5 to the ceramic substrate 2. It should be noted in this connection that when a film-formation process is used to form the film layers on the substrate, it is not always a prerequisite condition to carry out the heat-treatment for integrating the film layers with the substrate. Thus, for example, in order to provide an enhanced insulation between the two electrode layers 4, 6 on both sides of the piezoelectric film layer 5, there may be instances wherein a coating of insulation resin or the like is provided on the periphery of the transducer 3, or wherein synthetic resin dummy layers 9 as shown in FIGS. 1A and 1B are formed on the ceramic substrate 2, before formation of the upper electrode layer 6. In these cases, the upper electrode layer 6 is preferably formed by a process which does not require heat-treatment.

The heat treatment temperature suitable for integrating the film layers 4, 5, 6 of the piezoelectric transducer 3 and the ceramic substrate 2 and optionally for realizing a convex shape of the transducer 3 on the thin-walled region 2a of the substrate 2, as shown in FIG. 4, is generally within a range of 900°–1,400° C., preferably 1,000°–1,400° C. When the piezoelectric film layer 5 is subjected to a heat-treatment, in order to stabilize the composition of the piezoelectric material and avoid undesirable change in the composition in a high temperature condition, the heat-treatment is preferably performed while controlling the atmosphere by heating the vaporization source of the piezoelectric material as well. It is also advantageous to use a method of firing the piezoelectric film layer while it is shielded by a suitable cover member for preventing a direct exposure of the piezoelectric film layer to the firing atmosphere. In this case, the cover member consists preferably of a material which is similar to the ceramic substrate material.

The lower and upper electrode layers 4, 6 of the piezoelectric transducer 3 and the auxiliary electrode layer 10 may be formed of any electrically conductive material which can withstand the oxidizing firing and the heat-treatment atmosphere at a considerably high temperature condition as explained above. Thus, the electrode layers may be formed of a single metal, an alloy of metals, a mixture of metal or alloy with an electrically insulating ceramic material, or an electrically conductive ceramic material. However, it is preferable to use an electrode material whose major component is a noble metal having a high melting point, such as platinum, palladium, or rhodium, or an alloy such as silver-palladium, silver-platinum, platinum-palladium or the like. It is more preferable to use a cermet material of platinum and the ceramic material for the substrate, in particular a cermet material of platinum, the ceramic material for the substrate and the piezoelectric material for the piezoelectric film layer, in view of an improved adhesion of the electrode layers to the piezoelectric film layer and/or the ceramic substrate. As for additive materials to be added to the electrode material, use of vitreous material such as silicon oxide should be avoided because such material tends to react with the piezoelectric material during the heat-treatment thereby deteriorating the characteristics of the piezoelectric device. The amount of the substrate material to be added to the electrode material is preferably 5–30% by volume, and the amount of the piezoelectric material to be added to the electrode material is preferably 5–20% by volume.

The electrode layers 4, 6 consisting of a conductive material as mentioned above may have a thickness of 20 $\mu$m or less, preferably 5 $\mu$m or less.

The piezoelectric layer 5 may be formed of any piezoelectric material which exhibits a relatively large amount of field-induced strain or displacement when applied with a voltage, due to the piezoelectric effect. The piezoelectric material may be either a crystalline material or an amorphous material, and may be a semiconductive material or a dielectric or ferroelectric ceramic material. Furthermore, the piezoelectric material may either require an initial polarization or poling treatment or may not require such treatment.

Preferably, however, the piezoelectric materials which can be used in the present invention has a composition whose major component is lead zirconate titanate (PZT), lead magnesium niobate (PMN), lead nickel niobate (PNN), lead manganese niobate, lead antimony stannate, lead zinc niobate, lead titanate, lead zirconate or a mixture or solid solution thereof. Furthermore, the piezoelectric materials indicated above, whose major component is PZT or the like, may be added with a suitable amount of additives comprising an oxide or compound of lanthanum, barium, niobium, zinc, cerium, cadmium, chromium, cobalt, antimony, iron, yttrium, tantalum tungsten, nickel, manganese, lithium, strontium, calcium, and/or bismuth, so as to obtain a material whose major component is PLZT. However, addition of vitreous material such as silicon oxide should be avoided, since lead contained in the piezoelectric materials such as PZT tends to react with the vitreous material, making it difficult to achieve a desired composition of the piezoelectric film layer, thereby causing undesirable fluctuation and deterioration of the operational characteristics of the piezoelectric device.

Among the piezoelectric materials indicated above, it is preferable to use a material of which the major component comprises a mixture of lead magnesium niobate, lead zirconate and lead titanate, or a mixture of lead nickel niobate, lead magnesium niobate, lead zirconate and lead titanate. It is particularly advantageous to use a piezoelectric material of which the major component comprises a mixture of lead magnesium niobate, lead zirconate and lead titanate. Such a piezoelectric material has a particularly low reactivity with the substrate material during the heat-treatment, and is thus free from segregation of its components. Therefore, not only the edges of the piezoelectric layer 5 protruding beyond the lower electrode layer 4 can be maintained in such an incompletely bonded state with the ceramic substrate 2 for assuring a proper operation of the piezoelectric transducer 3, but also a desired composition or crystal structure can be readily obtained as a result of a suitable treatment for maintaining the composition. Moreover, such a piezoelectric material has a particularly high piezoelectric constant, and can be used as a material suitable for forming the piezoelectric film layer by the above-mentioned thick-film formation process such as screen printing, spraying, dipping, coating and the like. While such multi-component piezoelectric material has a piezoelectric characteristic which varies depending upon the composition of components, a three-component material composed of lead magnesium niobate, lead zirconate and lead titanate, which can be suitably used in the invention, preferably has a composition in the vicinity of phase boundaries of a pseudo-cubic crystal phase, a tetragonal crystal phase and a rhombohedral crystal phase. To assure sufficiently high piezoelectric constant and electromechanical coupling factor, it is particularly advantageous to use a composition containing 15–50 mol % of lead magnesium niobate, 10–45 mol % of lead zirconate and 30–45 mol % of lead titanate.

The piezoelectric transducer comprising the electrode layers 4, 6 and the piezoelectric film layer 5 described above generally has a thickness of 100 $\mu$m or less. To assure a relatively large amount of displacement at a relatively low voltage, the piezoelectric film layer 5 has a thickness which is preferably 50 $\mu$m or less, more preferably within a range of 3–40 $\mu$m.

In unimorph- or bimorph-type piezoelectric devices utilizing the transverse effect of the field-induced distortion, when the piezoelectric material requires a poling treatment, it is a general practice to perform the treatment by applying a voltage between the upper and lower electrodes. In the case of the above-mentioned film-type piezoelectric device as in the present invention, it is preferable to perform the poling treatment with the upper electrode film layer used as a positive electrode. That is to say, in the case of the piezoelectric layer formed in accordance with the present invention, stresses generated in the substrate during the sintering or heat treatment tend to form domains or orientations in a direction along the poling direction, which make it possible subsequently to perform an effective poling treatment.

In order to confirm the advantageous functions of the present invention, specimens of the piezoelectric devices were prepared to have a basic structure shown in FIG. 3, wherein the ceramic substrate includes a thin-walled region having a dimension of 0.8 mm × 3 mm and a thickness of 10 μm and the substrate is formed with a cavity. The substrate material of one comparative specimen is 96% alumina, and the substrate material of another comparative specimen and the specimen according to the present invention is zirconium oxide which has been partially stabilized by yttrium oxide. The piezoelectric material for forming the piezoelectric layer on the thin-walled region of the substrate is a mixture of lead magnesium niobate, lead zirconate and lead titanate. A platinum lower electrode layer of a thickness of 5 μm, a piezoelectric layer of a thickness of 30 μm comprising the above-mentioned piezoelectric material and an upper electrode layer of a thickness of 0.1 μm were sequentially formed on the substrate such that the piezoelectric layer substantially completely covers the lower electrode layer. In this instance, the upper electrode layer comprises two sub-layers formed by sputtering, i.e., a Cr sub-layer formed in the first stage and a Cu sub-layer formed on the Cr sub-layer in the second stage. With these specimens, displacement test has been performed to measure the displacement of the piezoelectric transducer actually achieved by applying an operational voltage of DC 30 V to the piezoelectric transducer.

Furthermore, testpieces were prepared to perform the peeling strength test for measuring the peeling strength which represents a force per unit area required to separate the piezoelectric layer from the substrate. Each testpiece includes a ceramic substrate and a piezoelectric layer formed directly on the substrate. The materials for the substrate and the piezoelectric layer of these testpieces are same as those in the above-mentioned specimens. The piezoelectric layer of each testpiece has an area of 4 mm$^2$ (=2 mm×2 mm) and a thickness of 30 μm. A substantially L-shaped lead comprising a 0.8 mmφ soft copper has been adhered to the surface of the piezoelectric layer, and then pulled by a tensile testing machine at a rate of 20 mm/min to evaluate the force which resulted in rupture of the bonded region between the ceramic substrate and the piezoelectric layer.

The results of the displacement test and the peeling strength test as mentioned above are shown in Table 1 below.

TABLE 1

| Type of Specimen | Substrate Material | Peeling Strength (kgf/mm$^2$) | Displacement At DC 30 V (μm) |
|---|---|---|---|
| Comparative Specimen 1 | 96% Alumina | >0.5[3] | 0.5 |
| Comparative Specimen 2 | Zirconia[1] | 0.25 | 1.5 |
| Specimen of the Invention | Zirconia[2] | <0.0025[4] | 2.0 |

[1] Partially stabilized zirconia added with 3 mol % of yttrium oxide and 5 wt % of silicon oxide.
[2] Partially stabilized zirconia added with 3 mol % of yttrium oxide.
[3] Separation of adhesive for bonding the lead occurred at the force of 2 kg, before separation of the substrate and the piezoelectric layer.
[4] For some testpieces, measurement could not be performed due to the peel-off of the piezo-electric layer from the substrate during adhesion of the lead to the piezoelectric layer. Also, some testpieces exhibited a natural separation after heat treatment of the piezoelectric layer.

As can be appreciated from Table 1 above, the piezoelectric device according to the present invention provides an excellent conversion efficiency which makes it possible to obtain a relatively large displacement of the piezoelectric transducer at a given operational voltage, as compared to the conventional devices. The improvement in the conversion efficiency results from an incompletely bonded state of the piezoelectric transducer to the ceramic substrate.

It will be readily appreciated from the foregoing detailed description that the present invention makes it readily possible to manufacture the piezoelectric device with an improved productivity, because it is not necessary to align the edges of the piezoelectric layer with those of the first electrode layer. The piezoelectric layer of the device according to the present invention has at least one edge in the form of an extension which protrudes beyond the first electrode layer, and thus completely covers the first electrode layer to avoid short-circuit between the lower and upper electrode layers. Moreover, the incompletely bonded state between the ceramic substrate and at least one edge of the piezoelectric layer protruding beyond the lower electrode layer allows the piezoelectric layer to be moved relative to the substrate in an unrestricted sense. It is thus possible to achieve satisfactory reliability and functions of the device, e.g., generation of a large force or displacement or a high output voltage level.

The present invention thus provides an improved piezoelectric device which can be readily manufactured with an improved productivity and which yet achieves satisfactory reliability and functions by avoiding short-circuit between the electrode layers while ensuring an unrestricted movement of the piezoelectric layer relative to the substrate.

While the present invention has been described with reference to some preferred embodiments, they were given by way of examples only. It is of course that various changes and modifications may be made without departing from the scope of the present invention as defined by the appended claims.

We claim:

1. A piezoelectric device comprising an at least locally thin-walled ceramic substrate and at least one piezoelectric transducer formed on said substrate, said piezoelectric transducer including a first electrode layer, a piezoelectric layer and a second electrode layer which are sequentially laminated with each other, said piezoelectric layer having a dimension which is sufficient to cover substantially completely the first electrode layer, and further having at least one edge in the form of an extension which protrudes beyond said first electrode layer and which is at least locally incompletely bonded to the ceramic substrate.

2. A piezoelectric device as claimed in claim 1, wherein said at least one edge of the piezoelectric layer has an average peeling strength which is not greater than 0.125 kgf/mm$^2$, said peeling strength representing a force per unit area which is required to separate the piezoelectric layer from said substrate.

3. A piezoelectric device as claimed in claim 2, wherein said average peeling strength is not greater than 0.025 kgf/mm$^2$.

4. A piezoelectric device as claimed in claim 3, wherein said average peeling strength is not greater than 0.0125 kgf/mm$^2$.

5. A piezoelectric device as claimed in claim 1, further comprising at least one dummy layer for incompletely bonding said at least one edge of the piezoelectric layer to said ceramic substrate.

6. A piezoelectric device as claimed in claim 5, wherein said dummy layer comprises an electrically insulating material.

7. A piezoelectric device as claimed in claim 1, wherein said ceramic substrate comprises a ceramic material having a low reactivity with the piezoelectric material forming said piezoelectric layer.

8. A piezoelectric device as claimed in claim 1, wherein said ceramic substrate comprises zirconium oxide as a major component, said zirconium oxide having a completely or partially stabilized crystal phase.

9. A piezoelectric device as claimed in claim 8, wherein said zirconium oxide has a crystal phase which has been completely or partially stabilized by addition of at least one member selected from a group consisting of yttrium oxide, cerium oxide, magnesium oxide and calcium oxide.

10. A piezoelectric device as claimed in claim 1, wherein said piezoelectric layer comprises a material having a major component which comprises a mixture of lead magnesium niobate, lead zirconate and lead titanate.

11. A piezoelectric device as claimed in claim 1, wherein said piezoelectric layer comprises a material having a major component which comprises a mixture of lead nickel niobate, lead magnesium niobate, lead zirconate and lead titanate.

12. A piezoelectric device as claimed in claim 1, wherein said piezoelectric transducer is in the form of a film having a convex shape so as to protrude toward said substrate.

* * * * *